(12) United States Patent
Nautiyal et al.

(10) Patent No.: US 7,372,764 B2
(45) Date of Patent: May 13, 2008

(54) LOGIC DEVICE WITH REDUCED LEAKAGE CURRENT

(75) Inventors: Vivek Nautiyal, District Garhwal (IN); Ashish Kumar, Ranchi (IN)

(73) Assignee: STMicroelectronics Pvt. Ltd., Noida, IN (US)

( * ) Notice: Subject to any disclaimer, the term of this patent is extended or adjusted under 35 U.S.C. 154(b) by 23 days.

(21) Appl. No.: 11/200,867

(22) Filed: Aug. 10, 2005

(65) Prior Publication Data

US 2006/0050590 A1    Mar. 9, 2006

(30) Foreign Application Priority Data

Aug. 11, 2004    (IN)    ............ 1492/DEL/2004

(51) Int. Cl.
*G11C 5/14*    (2006.01)

(52) U.S. Cl. .............. 365/229; 365/211; 365/212; 365/226

(58) Field of Classification Search ........... 365/185.16, 365/211 X, 212 X, 226 X, 229, 211, 212, 365/226; 327/262
See application file for complete search history.

(56) References Cited

U.S. PATENT DOCUMENTS

| | | | | |
|---|---|---|---|---|
| 6,411,149 B1* | 6/2002 | Ooishi | ............ | 327/281 |
| 6,836,179 B2* | 12/2004 | Mizuno et al. | ............ | 327/544 |
| 7,107,467 B2* | 9/2006 | Lee et al. | ............ | 713/300 |
| 2003/0102903 A1* | 6/2003 | Cho | ............ | 327/544 |

* cited by examiner

*Primary Examiner*—Van Thu Nguyen
(74) *Attorney, Agent, or Firm*—Gardere Wynne Sewell LLP

(57) ABSTRACT

A logic device operates with reduced leakage current. Controllability is achieved by using a reference voltage to control the amount of leakage reduction. A method of temperature dependent reference voltage generation is given which maintains virtual supply in acceptable range to provide sufficient noise margin in logic devices including memory cells.

13 Claims, 13 Drawing Sheets

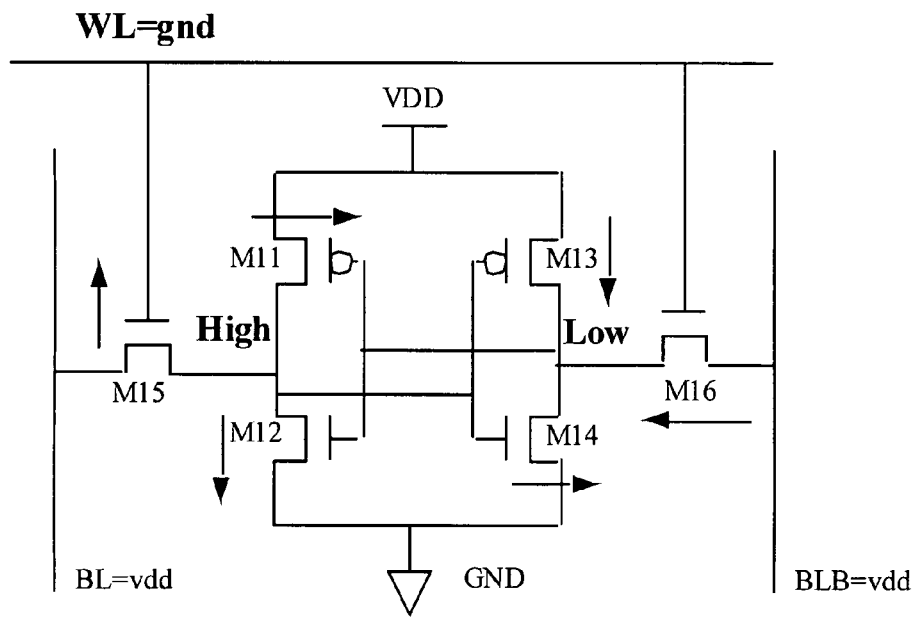
*Figure 1: Standby current component of 6T SRAM cell (Prior Art)*
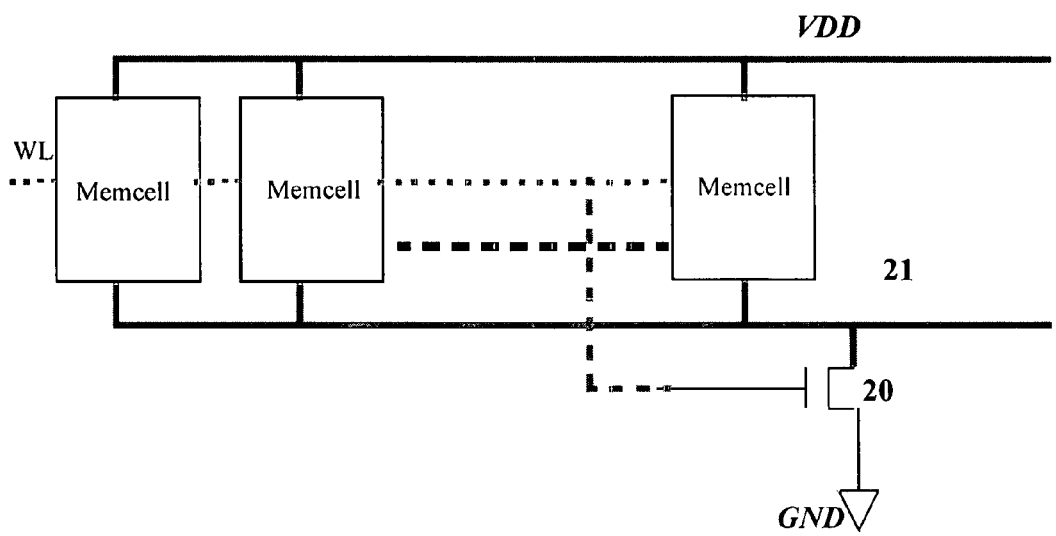
Fig. 2
*(Prior Art)*

LOGIC DEVICE WITH REDUCED LEAKAGE CURRENT

PRIORITY CLAIM

The present application claims priority from Indian Patent Application No. 1492/Del/2004 filed Aug. 11, 2004, the disclosure of which is hereby incorporated by reference.

BACKGROUND OF THE INVENTION

1. Technical Field of the Invention

The present invention relates to a logic device with reduced leakage current.

2. Description of Related Art

As the technology is shrinking, leakage current of devices is becoming a prime concern because it increases in the same order as that of active power. This increase in leakage is not only a concern in terms of higher power consumption but also for high performance memories as it affects bit line split.

FIG. 1 is a circuit diagram showing standby current components of a 6T SRAM cell. The cell comprises of transistors M11 to M16 with the interconnections as shown. The total leakage current is sum of the currents of M13, M12 and M16 and on state gate leakage of transistors M11 and M14 and accumulation mode gate leakage of transistor M15. Many efforts have been made to reduce leakage current. Some solutions use transistors with a high threshold voltage Vt for access while others make use of a dual threshold transistor.

Out of the many solutions offered, a solution to reduce leakage power is proposed by Kaushik Roy, Hai Li, "DRG-Cache: A Data Retention Gated ground Cache for Low Power" 2002 ACM 1-58113-461-Apr. 2, 2006 (the disclosure of which is hereby incorporated by reference). With reference to FIG. 2, which reproduces a circuit diagram, this article utilizes a gated ground NMOS transistor (20) between the ground GND and an array of SRAM cells (21). This NMOS transistor (20) is switched off during standby mode. This causes a significant increase in drain potential of the NMOS transistor (20) due to leakage.

FIG. 3 details another approach as mentioned in U.S. Pat. No. 6,314,041 (the disclosure of which is hereby incorporated by reference). In this approach, diodes M32 and M34 are connected to the memory column MC to provide limited supply in standby. This provides an alternative to the memory column for limiting voltage V intended for guaranteeing the operation of the memory column when transistors M31 and M33 are not active.

Respective diodes M32 and M34 connected in parallel with transistors M31 and M33, maintain steady state constant potential at virtual supply plane during standby state.

In the stand-by mode, if the equilibrium voltage across transistors M31 and M33 is smaller than the diode threshold voltage, the circuit operates in a normal operating mode. The transistors M31 and M33 are on and the column operates exactly like a conventional column in read/write modes. However, if the equilibrium voltage exceeds, for any reason, the diode threshold voltage, diodes M32 and M34 turn on. It is thus guaranteed that voltage V is never smaller than VDD minus twice the threshold voltage of a diode. Detailed working of this circuit can be obtained by reference to the referenced patent.

Current leakage is a function of variation in temperature and process. This leads to higher variation in virtual supply and virtual ground voltage as shown in FIG. 12. Particularly for a temperature variation of 25° C. to 125° C. leakage current of 100 nm transistor varies more than 100 times. This poses a serious problem on the methods discussed so far. Even with a diode connected scheme the variation in leakage, and hence the variation in noise margin, may lead to unacceptable levels. The size of the diode needed for an acceptable variation is high. With technology scaling, leakage reduction during active modes is also needed to be selectively applied in different portions of the core. Methods of leakage reduction should be tolerant to such conditions otherwise this may lead to a data integrity problem.

While the above-mentioned prior art solutions reduce leakage up to a certain extent, an extra NMOS/diode is needed for every 16 cells or for each memory column. Since the extra NMOS used is at the elementary level (one for 16 cells), the noise generated due to selection/deselection of NMOS affects the cell. Moreover, there is no escape for noise margin degradation with temperature variation.

All the techniques discussed so far were analyzed at deep-sub micron technology (sub-130 nm). Leakage current at these technology nodes has increased many fold. Particularly for systems on chip, excessive leakage may result in temperature rise and hence device failure. So a method is needed which reduces leakage when device is not operational as well as when the device is operational without the loss of reliability. In some cases at high temperatures, measures for leakage reduction are required.

A need exists in the art to provide an area efficient method of leakage reduction.

A need also exists in the art to provide a method to maintain virtual supply in range to provide sufficient noise margin.

A need further exists in the art to provide an area-effective overhead scheme in case of active constriction, also giving an edge over the leakage reduction.

A further need exists in the art to utilize the same size of NMOS for a bigger block of cells as active constriction is used.

There is also a need in the art to reduce impact of noise due to selection and deselection of transistors as constriction at the Global wordline level separates the NMOS/PMOS switch from the cell array.

SUMMARY OF THE INVENTION

An embodiment of the invention provides a logic device with reduced leakage current comprising an array of logic devices. A switch is connected between each supply terminal and each virtual supply terminal of said logic devices for sourcing/sinking current to said logic devices. Voltage controlled constriction devices are connected between said supply terminals and said virtual supply terminals, said voltage controlled constriction devices being biased to reduce the leakage current in an area efficient manner.

The logic device includes memory cells, SRAM based content addressable memory, bitline precharge, or other logic circuitry.

The constriction devices are biased from defined voltage reference levels.

The constriction devices are biased from diodes/diode connected transistors connected between said supply terminals and gates of said constriction devices; and a temperature tracking mechanism connected between said diodes/diode connected transistors.

The constriction devices comprise a small-sized PMOS transistor connected between said supply terminals and said virtual supply terminals of said logic devices and a small-sized NMOS transistor connected between said supply terminals and said virtual supply terminals of said logic devices. This provides constriction in the path of supply to said logic devices.

The temperature-tracking mechanism includes a reference logic cell array.

The decoupling capacitance is provided with said supply terminals of said logic devices to provide stable supply/sink in normal operation.

The present invention also provides a logic device with reduced leakage current comprising an array of logic devices and a switch connected between each supply terminal and each virtual supply terminal of said logic devices for sourcing/sinking current to said logic devices. Voltage controlled constriction devices are connected between said supply terminals and said virtual supply terminals. The voltage controlled constriction devices are biased from diodes/diode connected transistors connected between said supply terminals and gates of said constriction devices. A temperature tracking mechanism is connected between said diodes/diode connected transistors thereby reducing the leakage current in an area efficient manner.

An embodiment of the instant invention further provides a method for providing an area efficient logic device with reduced leakage current comprising adjusting the virtual supply levels using voltage controlled constriction devices from a reference cell array that tracks the leakage current of the logic devices.

An embodiment of the invention comprises an integrated circuit including logic circuitry coupled to a virtual ground, and a ground constriction circuit coupled between the virtual ground and a ground reference, the ground constriction circuit including a first transistor source/drain coupled between the virtual ground and ground reference and having a gate terminal coupled to receive a first control signal that changes an amount of current sourced by the first transistor.

An embodiment of the invention comprises an integrated circuit including logic circuitry coupled to a virtual ground, the logic circuitry operable in a normal mode and a standby mode, and a ground constriction circuit coupled between the virtual ground and a ground reference, the ground constriction circuit operable to source a first level of current when the logic circuitry is in normal mode and a second level of current when the logic circuitry is in standby mode.

An embodiment of the invention comprises an integrated circuit including a plurality of memory cells arranged as a memory block coupled to a virtual ground, and a ground constriction circuit coupled between the virtual ground and a ground reference, the ground constriction circuit operable to source a first level of current when the memory block is in active and a second level of current when the memory block is inactive.

Further embodiments include a supply constriction circuit in addition to the ground constriction circuit.

Further embodiments also include a leakage tracking circuit operable to control the operation of the ground/supply constriction circuits.

BRIEF DESCRIPTION OF THE DRAWINGS

A more complete understanding of the method and apparatus of the present invention may be acquired by reference to the following Detailed Description when taken in conjunction with the accompanying Drawings wherein:

FIG. 1 is a circuit diagram of a 6T cell showing standby current components;

FIG. 2 shows a diagram of a prior art DRG-cache;

DETAILED DESCRIPTION OF THE DRAWINGS

Embodiments of the present invention propose a solution which uses constriction on supply and ground during standby state of a memory. Both Vdd and ground are not directly applied to the SRAM cell array. Though the concept is explained for SRAM array, it can be used for SRAM based CAM, Bitline precharge, or other logic circuitry, as would be understood by those skilled in the art.

Figure 3:
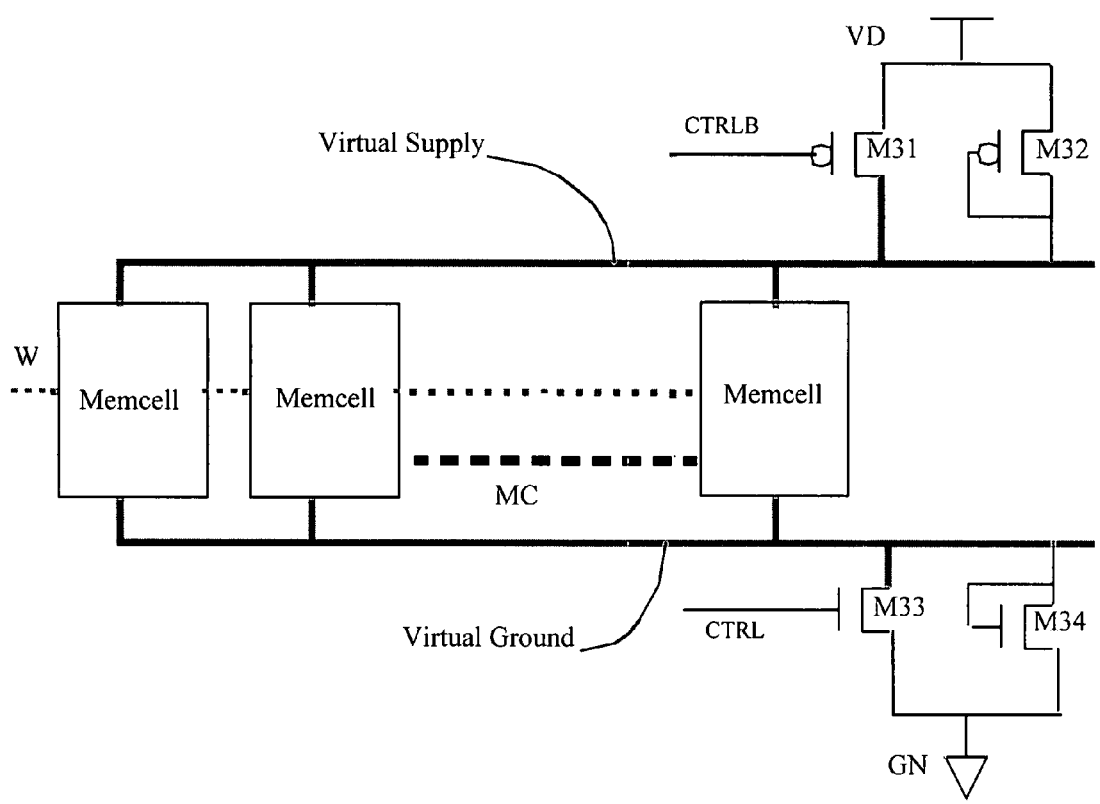
FIG. 3 shows a diagram of circuit as taught by U.S. Pat. No. 6,314,041.
Figure 4:
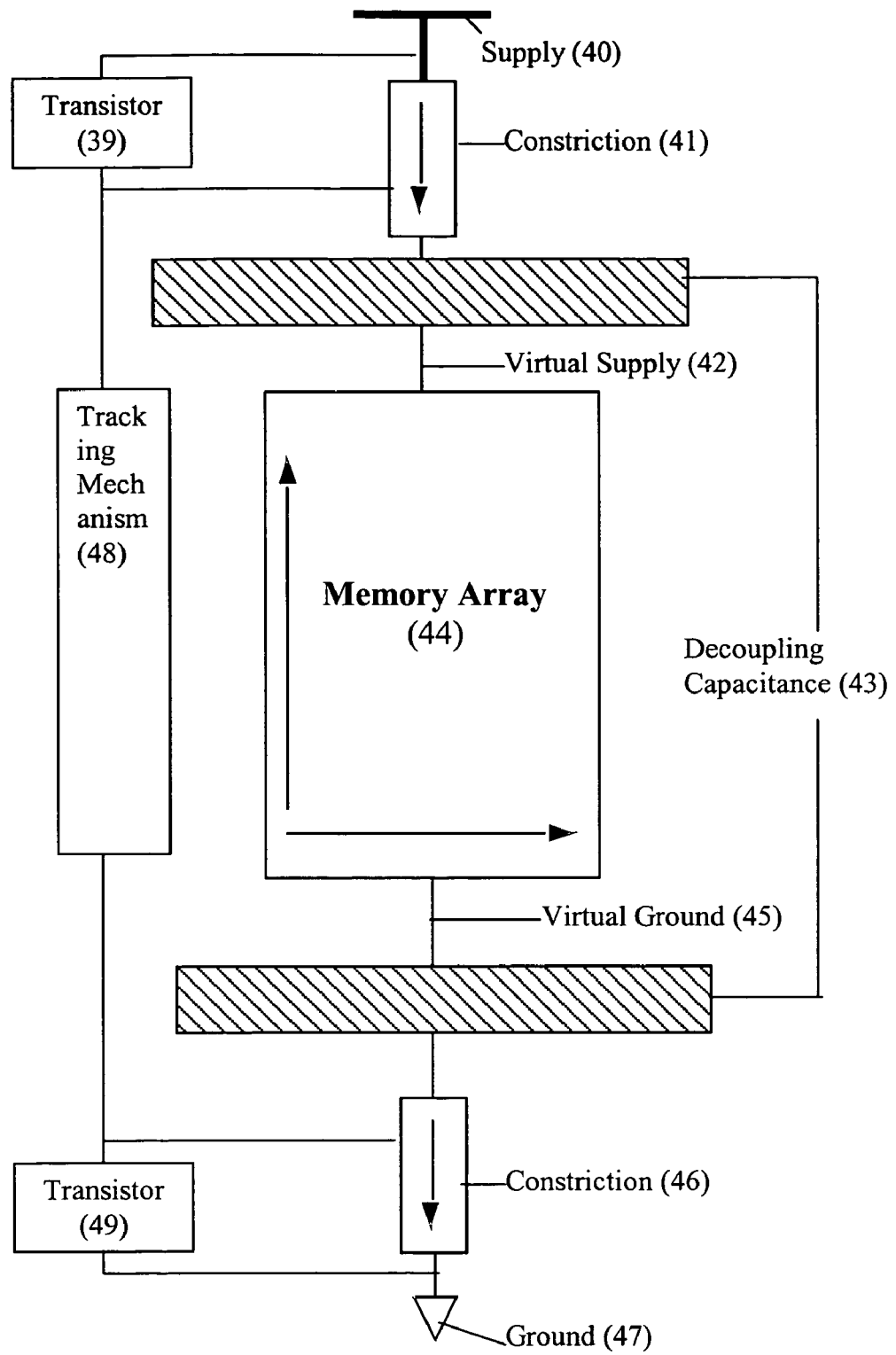
FIG. 4 gives block level representation of a scheme in accordance with an embodiment of the invention.

FIG. 4 shows a block diagram of an embodiment of the proposed scheme. It comprises of a memory array (44) connected to the decoupling capacitance (43), two constrictions (41) and (46) provided at supply (41) and ground (47), respectively, virtual supply (42) and virtual ground (45) created due to constrictions (41) and (46) and a tracking mechanism (48) connected between supply and ground via transistors (39) and (49).

The memory array (44) comprises a plurality of SRAM cells. The constrictions (41) and (46) comprise of small sized PMOS and NMOS transistors, respectively, in parallel with another PMOS transistor and NMOS transistor. A constriction in this context means an active constriction realized with a diode or saturated small transistor working as a constant source. When the memory cells of the memory array (44) are working in normal mode, normal read/write operations are performed.

In the standby mode, the constriction transistors (41) and (45) come into play. In one embodiment of the invention, the constriction transistors (41) and (45) remain permanently on while in another embodiment they source current when a reference voltage is applied on them. The decoupling capacitance (43) provides stable supply during normal operation.

This structure provides minimum leakage current with temperature variation. The tracking mechanism (48) comprises the same memory cells as contained in the memory array (44). The leakage current of memory cells contained in memory array (44) as well as tracking mechanism (48) changes due to temperature variation. This changes the biasing voltage of constriction transistors (41) and (46) thereby maintaining steady voltage across virtual supply

(42) and virtual ground (45). This mechanism helps in data retention even due to temperature changes while maintaining desired noise immunity at the same time.

Figure 5:
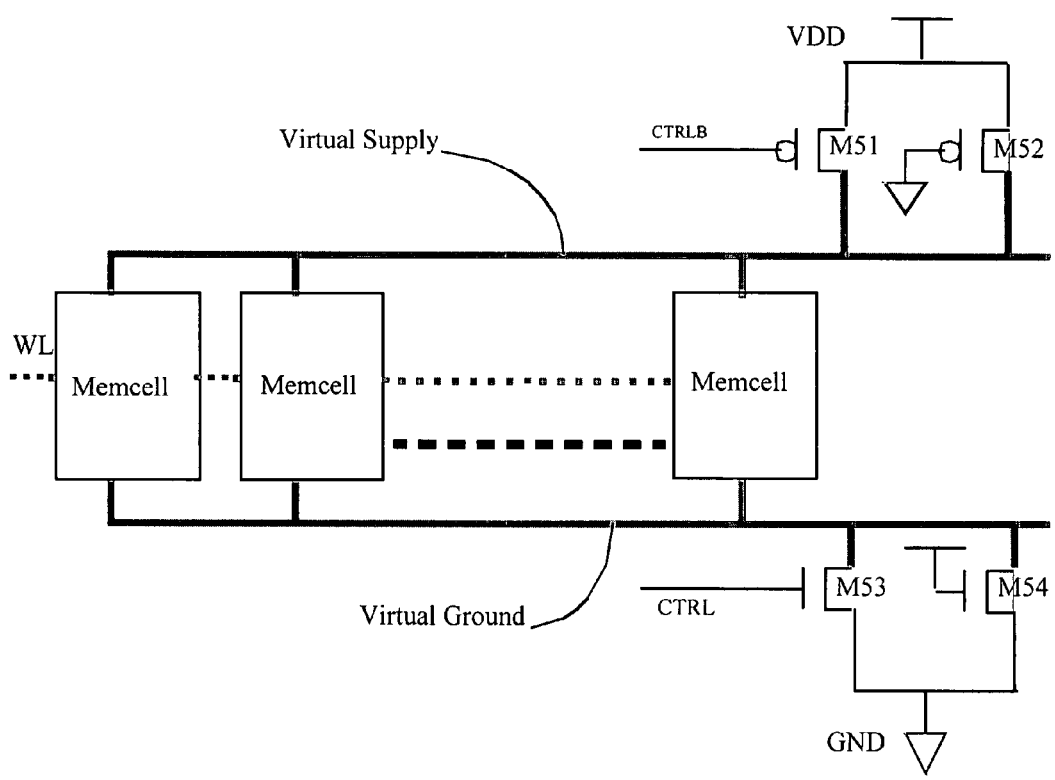
FIG. 5 is row level implementation of the scheme where constriction is applied on both supply and ground.

FIG. 5 shows the proposed scheme with constriction on both supply and ground levels. Here, VDD is not directly applied to the memory cell. Transistors M51 and M54 constrict the path of supply voltage and ground respectively. During standby mode when memory cells are not accessed, transistor M51 is off thereby constricting the path from Vdd to virtual supply while gate of small sized second PMOS M52 is connected to ground to work as a current source. Similarly ground is connected to virtual ground through transistors M53 and M54 whereas gate of transistor M54 is connected to the supply thereby acting as a constant source.

Transistors M51 and M53 are off in the standby mode while remaining on whenever corresponding memory cells are selected. The small-sized PMOS (M52) and NMOS (M54) transistors, whose gates are connected to gnd and Vdd respectively, provide active constriction thereby acting as a current source. The approach of supply constriction during standby mode provides data retention, which was previously achieved by using a transistor stack. Further constricting the source power helps in reduction in on state gate leakage as well as diode leakage.

The sink capability of the transistor (M54) is adjusted so as to provide virtual ground level in the standby state. Similarly transistor (M52) is provided for a constricted VDD thus, creating a virtual supply. This scheme results in a reduced leakage. However this is at the cost of reduced noise margin in the standby state. This margin is adjustable according to the size of the transistors used for constriction (M54, M52). Use of transistors in linear region provides large current source/sink and is applicable over a large block of memory.

It should be noted that in contrast with the gated Vdd/gnd scheme, where for a small block of memory, ground is completely turned off and the leakage current of the gated transistor provides the virtual ground level, an embodiment of the instant invention provides large current source/sink capability. The virtual ground level can be adjusted for an acceptable noise margin by adjusting the size of the gated transistor. However in deep-sub micron technologies the magnitude of leakage current increases many fold and the size of transistor required for complete blocking and virtual ground adjustment is very large.

Figure 6:
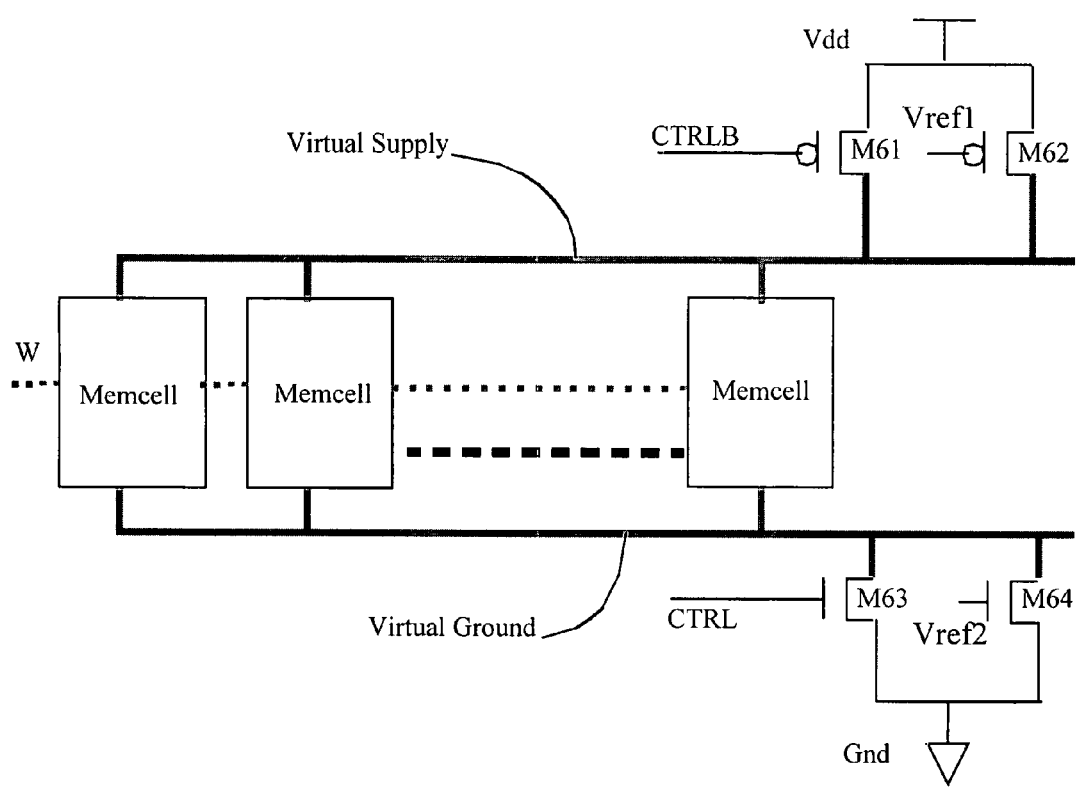
FIG. 6 shows a proposed scheme with constriction transistors controlled by reference voltages at both supply and ground.

FIG. 6 represents constriction transistors M62 and M64 controlled by reference voltages. As shown transistors M62 and M64 are connected to reference voltages Vref1 and Vref2 instead of to ground and Vdd, respectively. The transistors M61 and M63 are off during standby mode while transistors M62 and M64, connected as partially on transistors depending upon the reference voltages, maintain steady state constant potential at virtual supply and virtual ground during standby mode. This control helps to implement different levels of standby modes depending on the levels of virtual VDD and Virtual GND. Vref1 and Vref2 are used to control transistors M62 and M64, respectively.

Both the transistors M62 and M64 are operated in triode region and by changing the gate voltage we can change the slope of the region. Current drive is optimized for the chosen memory column. Also, the reference voltages can be provided from programmable sources, changing their levels and thus controlling the virtual ground and virtual Vdd as needed. As an example, in a 1.2 V supply scheme, Vref1 can be taken as 200 mv, and Vref2 as 900 mv. This is done to manipulate the drive strength of the transistors, as needed.

Figure 7:
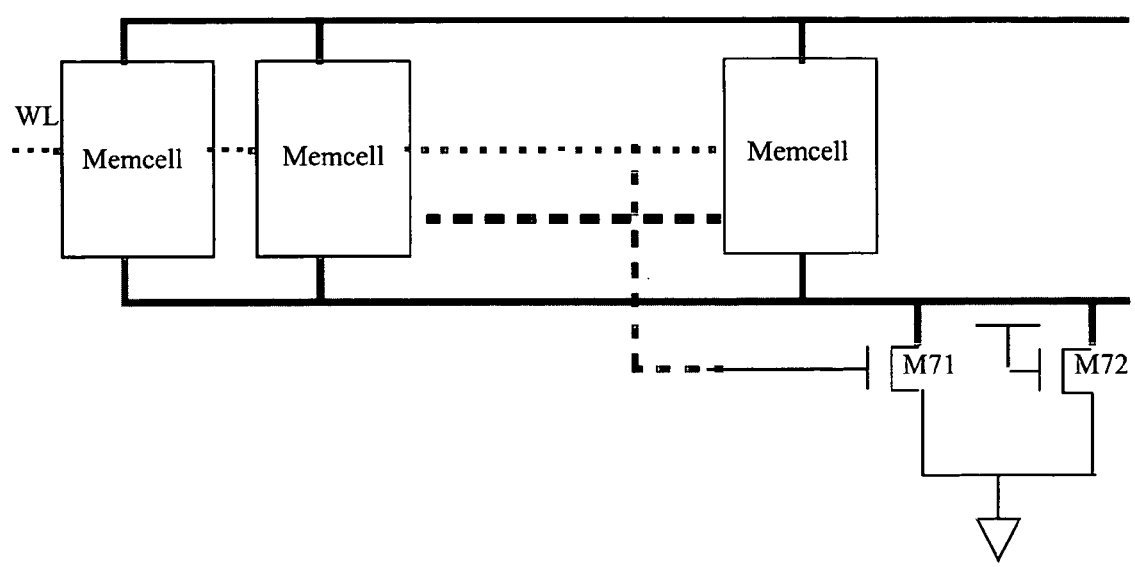
FIG. 7 shows constriction transistors controlled by reference voltages.

FIG. 7 is another embodiment of the invention with a row level implementation of scheme where constriction is applied only to the ground plane. The ground is connected to virtual ground through the bigger transistor M71 and the small transistor M72. The gate of transistor M72 is always connected to supply thereby acting as a current source. Transistor M71 is off in the standby mode and is on whenever the corresponding row is selected. This configuration is generally considered when an area effective solution is needed without requiring high noise immunity.

Said small transistor can be shared across the block. In a hierarchical memory it can be provided for the complete Global wordline.

Figure 8:
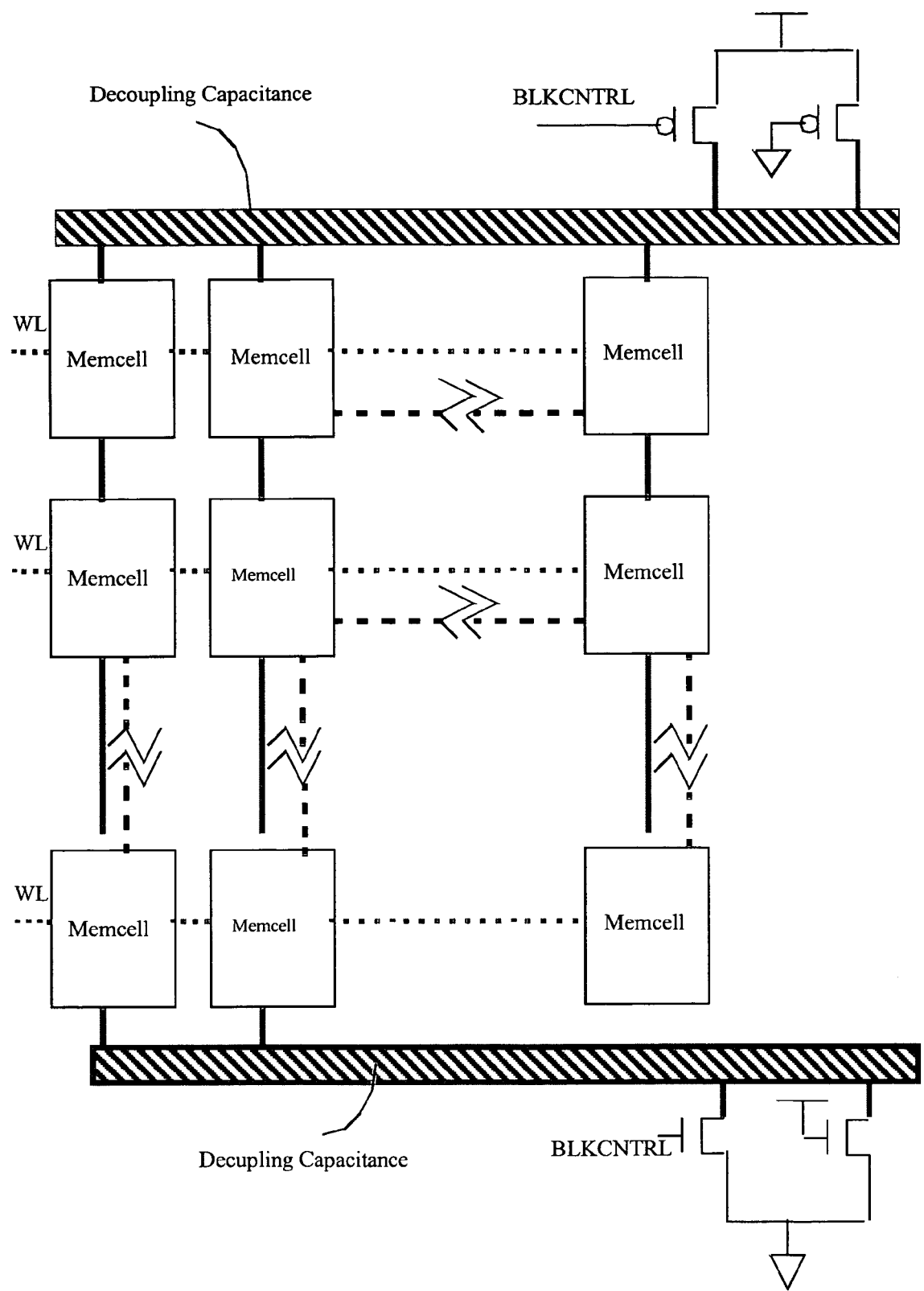
FIGS. 8 and 9 show implementation of a scheme with switch and active constriction shared across the memory array with decoupling capacitance (the scheme is shown with both VDD and Gnd and with only GND, respectively)

FIG. 8 shows another embodiment of the scheme where switch and active constriction are shared across the memory array. Decoupling capacitance is provided with virtual supply/ground plane to provide stable supply during normal operation. The constricted transistors permanently source current as they remain permanently on.

Figure 9:
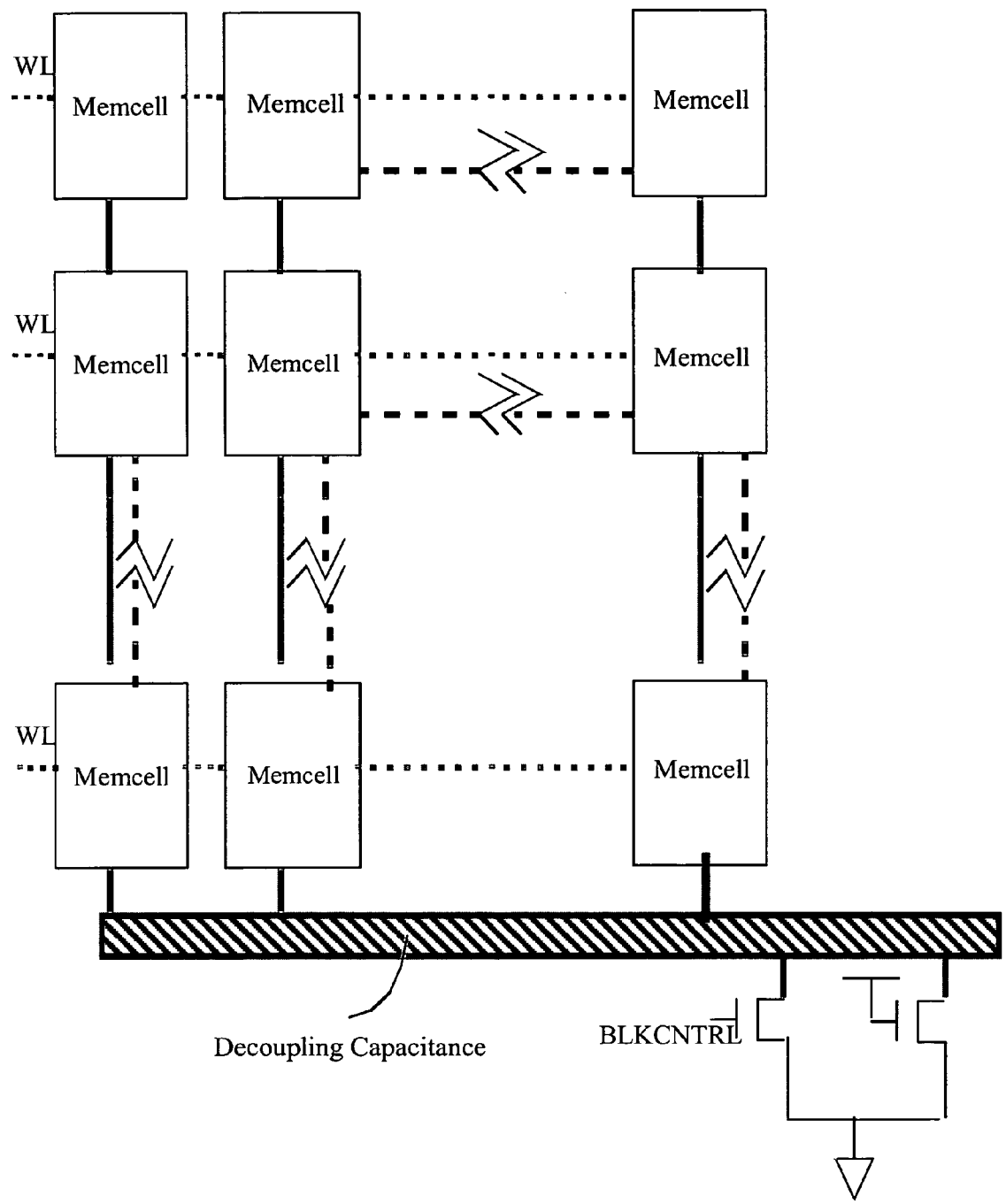

FIG. 9 shows another embodiment where decoupling capacitance is provided with GND only.

Figure 10:
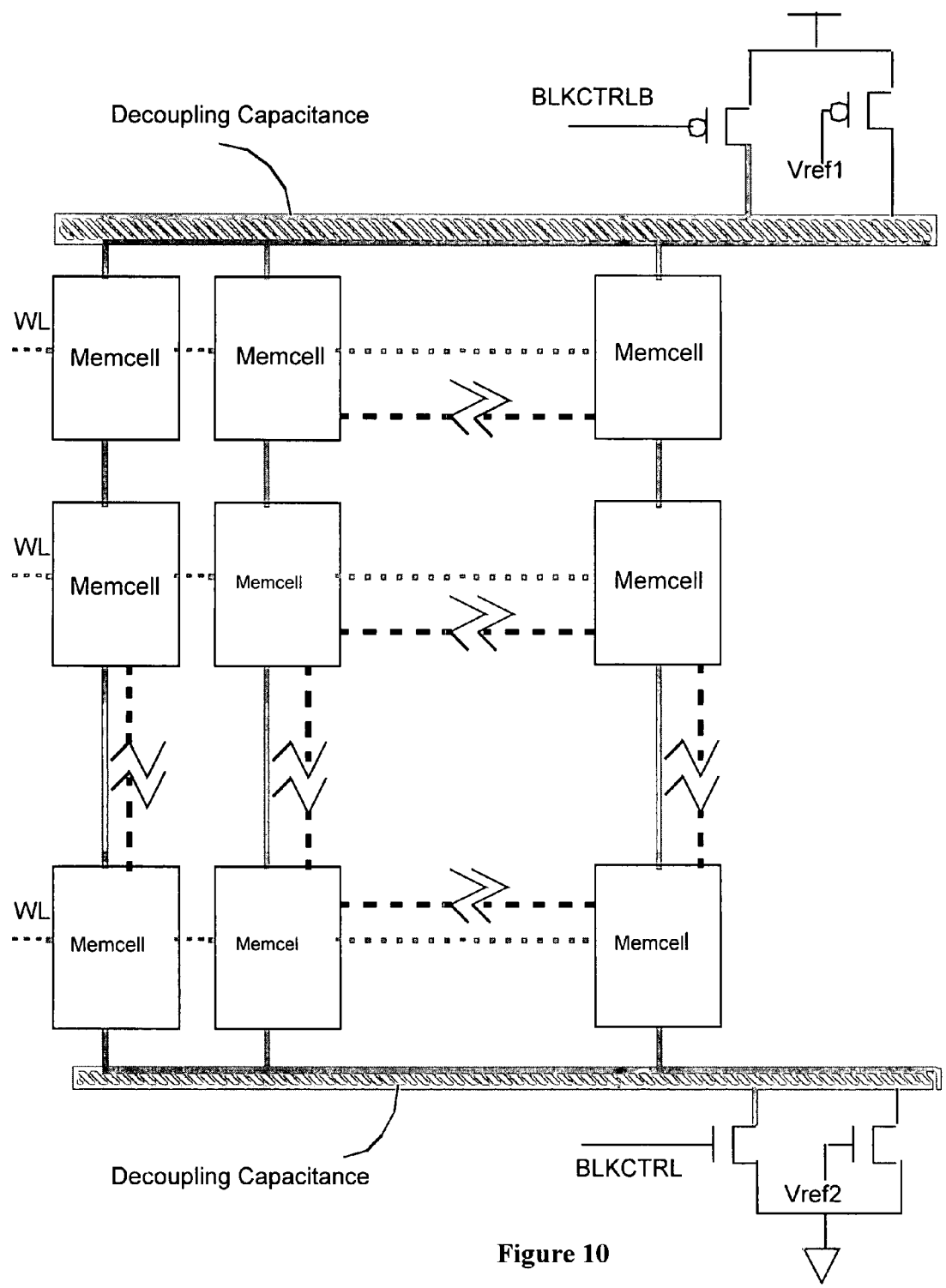
FIG. 10 shows an implementation of a scheme where reference controlled constriction is applied for the complete array.

FIG. 10 is implementation of scheme where reference controlled constriction is applied for the complete array along with decoupling capacitance.

Figure 11:
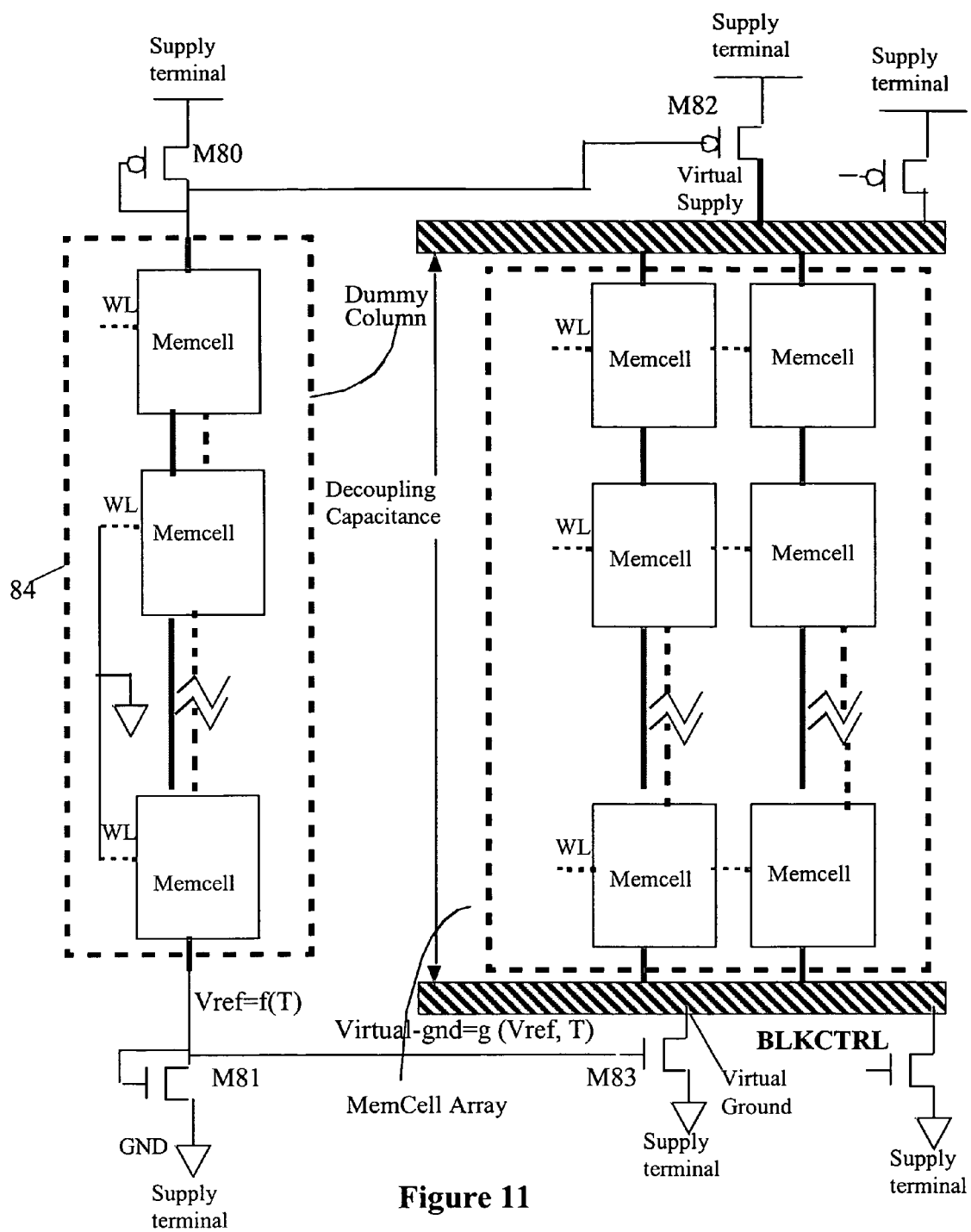
FIG. 11 explains the proposed reference column arrangement applied on the memory array.

FIG. 11 shows a reference column of memory cells 84. This column includes normal memory cells or dummy cells hard wired to a logic 0 or 1 state. It is suggested to use the same column although a separate column can be dedicated for the purpose over entire block since it is used only as a leakage reference. Any swing to virtual Vdd and virtual ground for the temperature dependent reference variation can be given. Diodes M80 and M81 connected with the dummy column 84 can be sized for the desired reference voltage swing. The virtual voltages vary with the variation of temperature dependent swing of Vref, which is tailored independently for the desired slope. This may be adjusted for stable virtual Vdd, virtual ground, as well as for variable virtual voltages, as follows:

$Vref=f(T)$;

$Vvirtual\text{-}plane=g(Vref,T)$.

This scheme is to be used locally within the small memory blocks to avoid large temperature variation across the block and hence deviation from the expected result. A fail-safe diode in parallel with the Vref connected transistor may be provided for such cases.

Although both Vdd and ground are shown connected to the dummy column as well as cell array, only ground control or Vdd control can also be used. Similarly temperature dependent Vref swing can be taken from Vref connected transistors in dummy column instead of diode connected.

Figure 12:
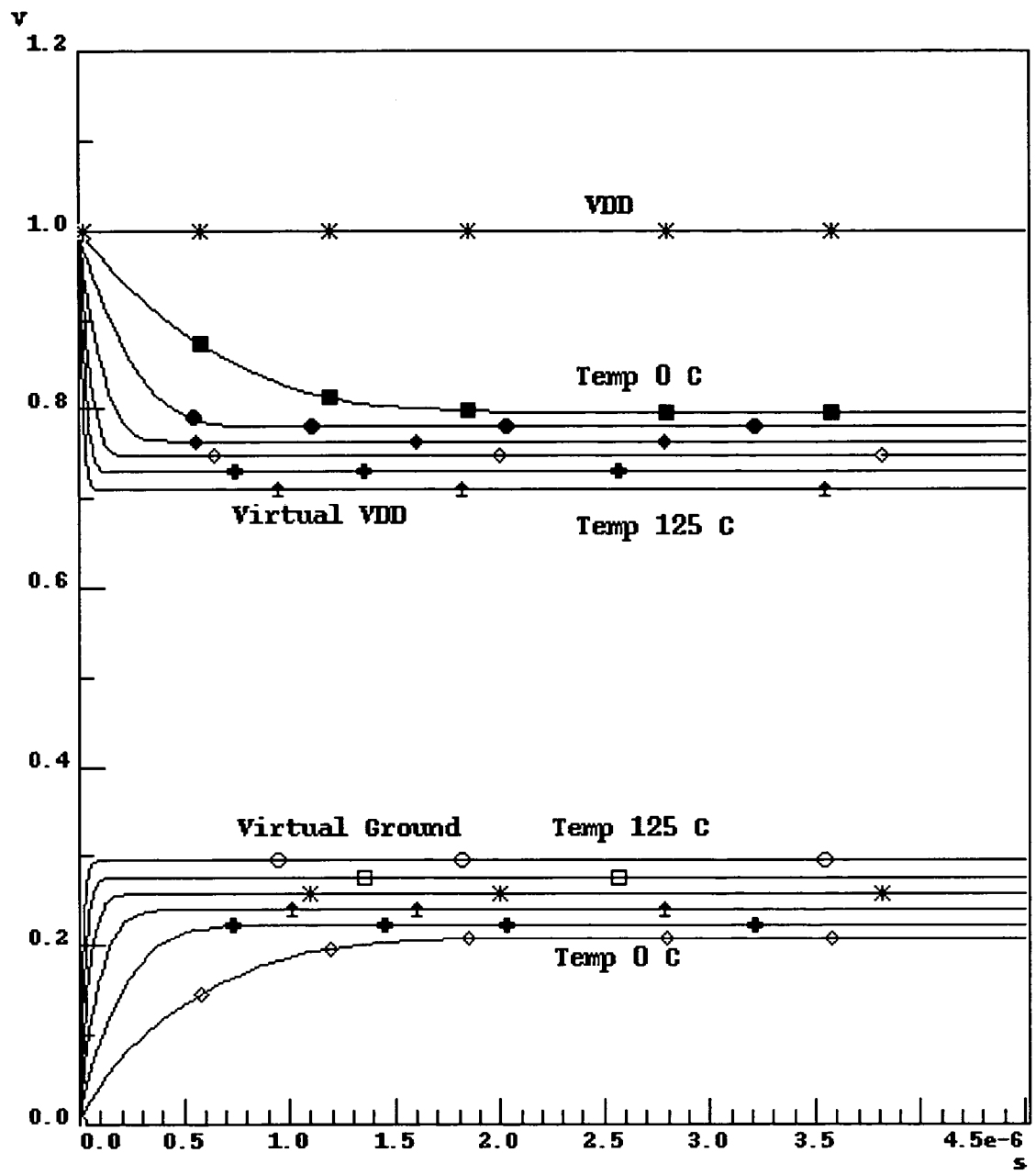
FIG. 12 displays the temperature dependent simulation result of the circuit disclosed by U.S. Pat. No. 6,314,041.

FIG. 12 shows variation of virtual ground and Vdd with temperature (diode connected). The noise margin decreases due to increase in temperature. As supply is already very small (1.0 V), this reduction may be unacceptable for some applications. Increasing the diode size too much takes lot of area and also results in decreased leakage prevention at lower temperature due to decreased virtual ground & increased virtual Vdd. With the second scheme with the transistor in triode region, variation results in an even worse condition, just like in the gated ground case. Virtual ground may increase up to (Vdd-Vt) level.

Also due to Vt scaling limitations we cannot put virtual ground and Vdd at arbitrarily small levels, so as to take care of high temperature effects as well as desired leakage variations.

Figure 13:
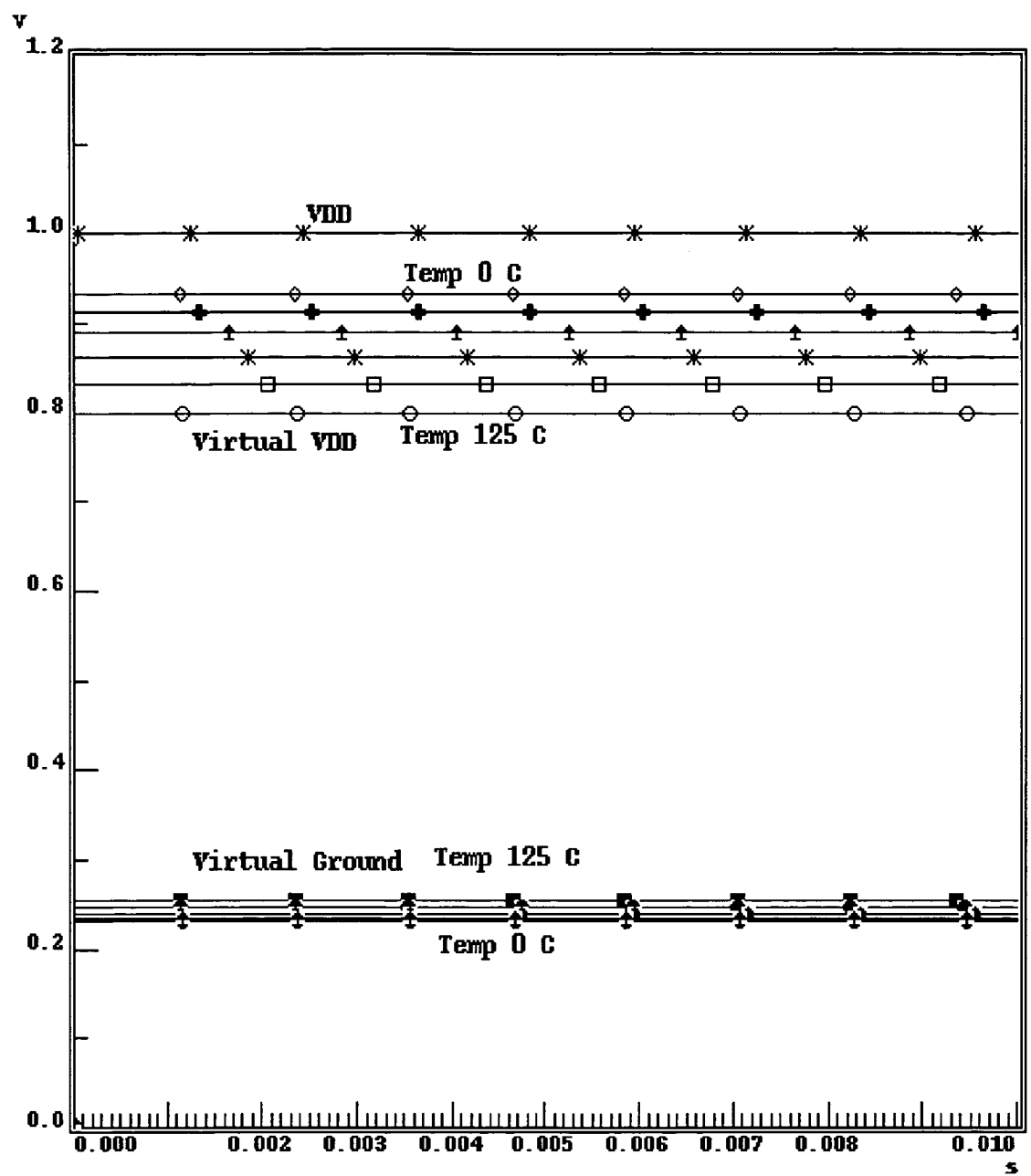
FIG. 13 displays results for the control of virtual gnd and Vdd with the help of a reference column.

FIG. 13 explains the use of temperature sensitive Vref control. Initial voltages can be chosen to take care of the swing due to temperature; also swing can be checked to take care of noise margin. Virtual ground is kept nearly constant and virtual Vdd is varied within acceptable limits to take care of the leakage control.

Figure 14:
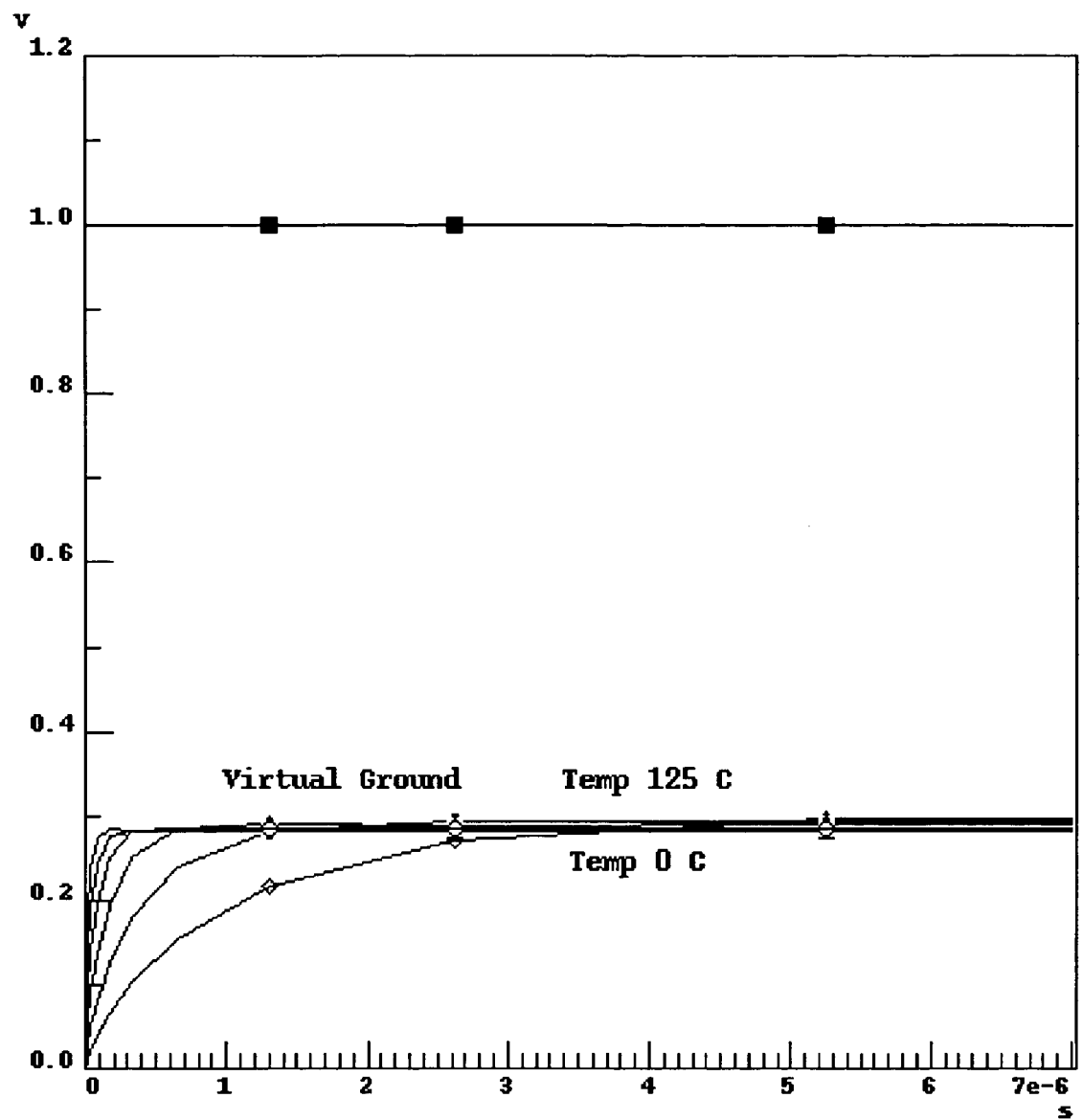
FIG. 14 displays results for only virtual ground control applied to keep noise margin constant.

FIG. 14 shows the use of scheme to keep virtual ground swing controlled at desired level by temperature controlled reference swing.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A logic device with reduced leakage current, comprising:
   an array of logic devices;
   a switch connected between each supply terminal and each virtual supply terminal of said logic devices for sourcing/sinking current to/from said logic devices; and
   voltage controlled constriction devices connected between said supply terminals and said virtual supply terminals, said voltage controlled constriction devices being biased by reference voltages between less than a supply voltage and more than a ground voltage to reduce the leakage current in an area efficient manner.

2. The logic device with reduced leakage current as in claim 1 wherein said logic device includes circuitry selected from the group consisting of memory cells, SRAM based content addressable memory, and bitline precharge circuitry.

3. The logic device with reduced leakage current as in claim 1 wherein said constriction devices are biased from the reference voltages whose levels are variably controlled.

4. A logic device with reduced leakage current, comprising:
   an array of logic devices;
   a switch connected between each supply terminal and each virtual supply terminal of said logic devices for sourcing/sinking current to/from said logic devices; and
   voltage controlled constriction devices connected between said supply terminals and said virtual supply terminals, said voltage controlled constriction devices being biased to reduce the leakage current in an area efficient manner;
   wherein said constriction devices are biased from diodes/diode connected transistors connected between said supply terminals and gates of said constriction devices, and a temperature tracking mechanism connected between said diodes/diode connected transistors.

5. The logic device with reduced leakage current as in claim 4 wherein said temperature-tracking mechanism includes a reference logic cell array.

6. The logic device with reduced leakage current as in claim 1 wherein said constriction devices comprise:
   a small-sized PMOS transistor connected between said supply terminals and said virtual supply terminals of said logic devices;
   a small-sized NMOS transistor connected between said supply terminals and said virtual supply terminals of said logic devices;
   thereby providing constriction in the path of supply to said logic devices.

7. The logic device with reduced leakage current as in claim 1 wherein a decoupling capacitance is provided with said supply terminals of said logic devices to provide stable supply/sink in normal operation.

8. A logic device with reduced leakage current, comprising:
   an array of logic devices;
   a switch connected between each supply terminal and each virtual supply terminal of said logic devices for sourcing/sinking current to said logic devices;
   voltage controlled constriction devices connected between said supply terminals and said virtual supply terminals;
   said voltage controlled constriction devices being biased from:
      diodes/diode connected transistors connected between said supply terminals and gates of said constriction devices; and
      a temperature tracking mechanism connected between said diodes/diode connected transistors, to thereby reducing the leakage current in an area efficient manner.

9. An integrated circuit, comprising:
   logic circuitry coupled to a virtual ground; and
   a ground constriction circuit coupled between the virtual ground and a ground reference, the ground constriction circuit including a first transistor source/drain coupled between the virtual ground and ground reference and having a gate terminal coupled to receive a first control signal having a voltage between but not equal to either a supply reference and the ground reference that changes an amount of current sourced by the first transistor.

10. The integrated circuit of claim 9 wherein the logic circuitry is coupled between the virtual ground and a virtual supply, further comprising a decoupling capacitance defining the virtual supply and virtual ground.

11. An integrated circuit, comprising:
    logic circuitry coupled to a virtual ground;
    a ground constriction circuit coupled between the virtual ground and a ground reference, the ground constriction circuit including a first transistor source/drain coupled between the virtual ground and ground reference and having a gate terminal coupled to receive a first control signal that changes an amount of current sourced by the first transistor; and
    a tracking circuit comprised of same logic circuitry and operable to track leakage current of that same logic circuitry and generate the first control signal to change the amount of current sourced by the first transistor so as to maintain a substantially steady voltage across the logic circuitry.

12. The integrated circuit of claim 9 wherein the logic circuitry is coupled between the virtual ground and a virtual supply, further comprising a supply constriction circuit coupled between the virtual supply and a supply reference, the supply constriction circuit including a second transistor source/drain coupled between the virtual supply and supply reference and having a gate terminal coupled to receive a second control signal that changes an amount of current sourced by the second transistor.

13. An integrated circuit, comprising:
    logic circuitry coupled between a virtual ground and a virtual supply;

a ground constriction circuit coupled between the virtual ground and a ground reference, the ground constriction circuit including a first transistor source/drain coupled between the virtual ground and ground reference and having a gate terminal coupled to receive a first control signal that changes an amount of current sourced by the first transistor;

a supply constriction circuit coupled between the virtual supply and a supply reference, the supply constriction circuit including a second transistor source/drain coupled between the virtual supply and supply reference and having a gate terminal coupled to receive a second control signal that changes an amount of current sourced by the second transistor; and a tracking circuit comprised of same logic circuitry and operable to track leakage current of that same logic circuitry and generate the first and second control signals to change the amount of current sourced by the first and second transistors so as to maintain a substantially steady voltage across the logic circuitry.

* * * * *